United States Patent
Tas et al.

(10) Patent No.: US 9,085,824 B2
(45) Date of Patent: Jul. 21, 2015

(54) CONTROL OF STRAY RADIATION IN A CVD CHAMBER

(75) Inventors: Guray Tas, Flanders, NJ (US); Jing Zhou, Bridgewater, NJ (US); Daewon Kwon, Whippany, NJ (US)

(73) Assignee: Veeco Instruments, Inc., Plainview, NY (US)

( * ) Notice: Subject to any disclaimer, the term of this patent is extended or adjusted under 35 U.S.C. 154(b) by 271 days.

(21) Appl. No.: 13/531,220

(22) Filed: Jun. 22, 2012

(65) Prior Publication Data
US 2013/0340677 A1 Dec. 26, 2013

(51) Int. Cl.
*G01J 5/00* (2006.01)
*C23C 16/46* (2006.01)
*C23C 16/52* (2006.01)

(52) U.S. Cl.
CPC .............. *C23C 16/46* (2013.01); *C23C 16/52* (2013.01); *Y10T 29/49826* (2015.01)

(58) Field of Classification Search
USPC ........ 118/724, 725; 374/1, 121, 123; 438/799
See application file for complete search history.

(56) References Cited

U.S. PATENT DOCUMENTS

| | | | |
|---|---|---|---|
| 5,766,363 A * | 6/1998 | Mizuno et al. | 118/725 |
| 5,960,555 A * | 10/1999 | Deaton et al. | 34/58 |
| 6,349,270 B1 | 2/2002 | Gurary et al. | |
| 6,492,625 B1 * | 12/2002 | Boguslavskiy et al. | 219/486 |
| 6,570,134 B2 * | 5/2003 | Suzuki et al. | 219/390 |
| 8,496,375 B2 | 7/2013 | Zettler et al. | |
| 2005/0272228 A1 * | 12/2005 | Ito et al. | 438/487 |
| 2008/0030715 A1 * | 2/2008 | Kondo et al. | 356/73 |
| 2011/0064114 A1 | 3/2011 | Zettler et al. | |
| 2013/0206006 A1 | 8/2013 | Krumbholz et al. | |

OTHER PUBLICATIONS

Creighton, J.R. et al.; "Improved InGaN Epitaxy Yield by Precise Temperature Measurement", Final Report for Project: DE-FC26-05NT42285; 29 pages; Reporting Period Start Date: Oct. 1, 2004, Reporting Period End Date: Nov. 30, 2006.

Tempsens Instruments; Pyrometry Fundamentals, pp. 59-68; prior to Feb. 2012.

Koleske, Daniel D.; "Improving Epitaxial Growth for LEDs", Sandia National Laboratories, 2008 DOE Solid-State Lighting R&D Workshop, Jan. 30, 2008; 16 pages.

(Continued)

*Primary Examiner* — Lisa Caputo
*Assistant Examiner* — Nasir U Ahmed
(74) *Attorney, Agent, or Firm* — Patterson Thuente Pedersen, P.A.

(57) ABSTRACT

An apparatus and method for controlling stray radiation within a CVD chamber. A heater array disposed beneath a wafer carrier for radiatively heating of the wafer carrier includes a peripheral or outermost heating element or elements. Scattered radiation originating from a designated segment of the peripheral heating element(s) can be reduced locally by one of several mechanisms, including reducing the emission (e.g., operating temperature) of the designated segment, or capturing or deflecting a portion of the radiation originating from the designated segment. In one embodiment, an electrical connector on a resistance heating element provides the reduced emission from the designated segment. It has been found that radiation thermometers fixed proximate an axis that extends from the center of the wafer carrier and across the designated segment is subject to less stray radiation, thus providing a more reliable temperature reading in the optical wavelengths.

12 Claims, 6 Drawing Sheets

(56) References Cited

OTHER PUBLICATIONS

Creighton, J.R. et al.; "Emissivity-correcting near-UV pyrometry for group-III nitride OMVPE", available online Nov. 28, 2005.
Application and File History of U.S. Appl. No. 13/531,162, filed Jun. 22, 2012, Inventors Guray Tas et al.
Mitrovic, B. et al. "Reactor Design Optimization Based on 3D CFD Modeling of Nitrides Deposition in MOCVD Vertical Rotating Disc Reactors"; Jun. 22, 2005.
Breiland, W.G.; Sand Report; "Reflectance-Correcting Pyrometry in Thin Fllm [sic] Deposition Applications" Printed Jun. 2003; 85 pages.

* cited by examiner

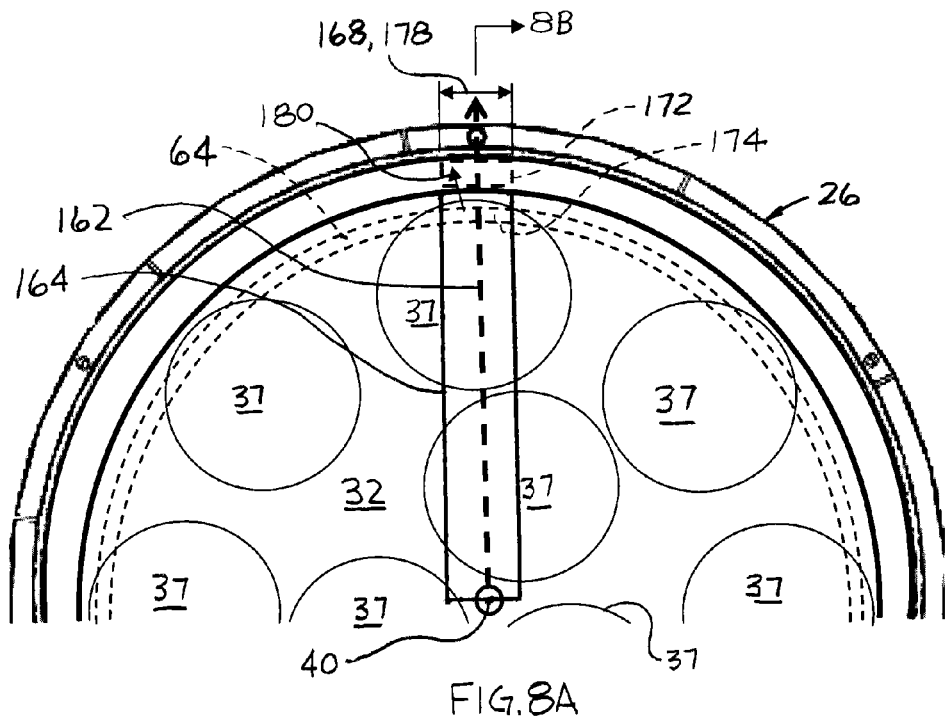
FIG. 8A
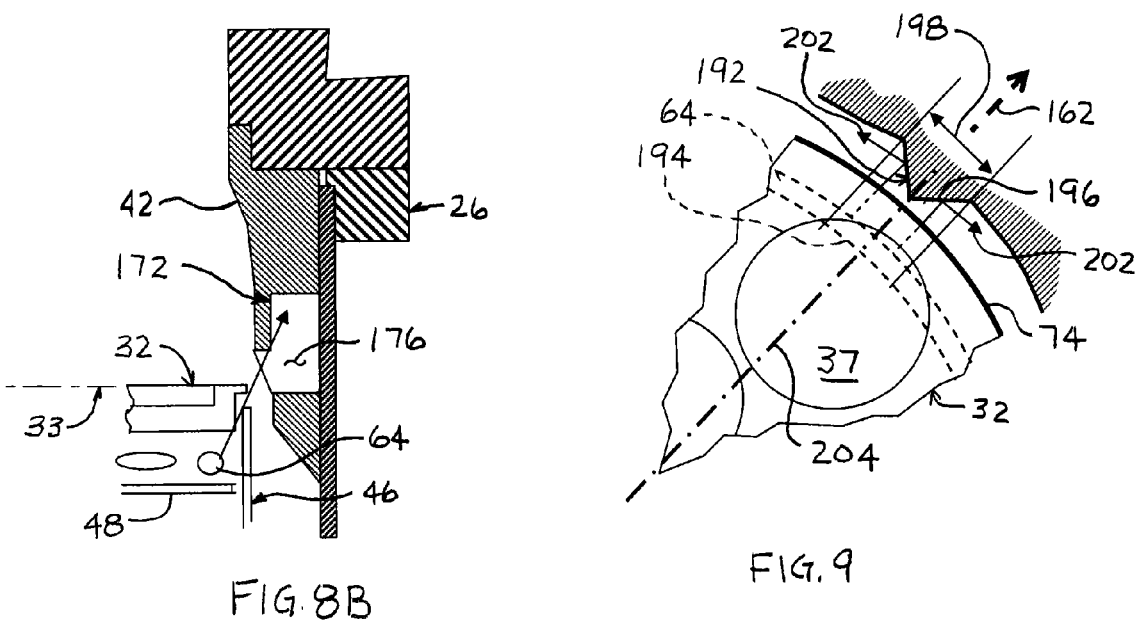
FIG. 8B
FIG. 9

CONTROL OF STRAY RADIATION IN A CVD CHAMBER

FIELD OF THE INVENTION

The disclosure is directed generally to radiation thermometry systems, and more specifically to control of stray radiation in the implementation of radiation thermometers or pyrometers.

BACKGROUND

Metalorganic Chemical Vapor Deposition (MOCVD) is a chemical vapor deposition technique for growing crystalline layers in processes such as the production of semiconductors. The MOCVD process is implemented in a reactor chamber with specially designed flow flanges that deliver uniform reactor gas flows to the reactor chamber.

The temperature of the crystalline layers during the MOCVD process are typically measured using non-contact devices such as radiation thermometers or pyrometers. Such crystalline growth materials include silicon carbide (SiC), zinc selenide (ZnSe), and gallium nitride (GaN) based materials such as GaN and AlGaN. Certain crystalline growth materials have emission characteristics that limit the wavelength of operation for radiation thermometry. For example, gallium nitride (GaN), grown on a sapphire substrate, can have a transmittance greater than 50% for wavelengths longer than 450 nanometers (nm) at process temperatures. Thus, at wavelengths longer than 450 nm, a substantial fraction of the radiation leaving the surface of a GaN layer originates from the structure beneath the substrate that is in the line of sight of the radiation thermometer (e.g., a wafer carrier). Radiation that passes through the GaN layer is not indicative of the temperature of the GaN layer. Accordingly, radiation thermometers have been developed that detect radiation at wavelengths shorter than 450 nm (corresponding roughly to the blue, violet and ultraviolet wavelengths). See, e.g., U.S. Patent Application Publication No. 2011/0064114 to Zettler et al. (hereinafter "Zettler"), disclosing a pyrometer adapted to detect radiation in the range of 250 nm to 450 nm.

An issue with the use radiation thermometers is the detection of unwanted radiation. One source of unwanted radiation is unfiltered radiation that detected from outside the desired band pass of detection. Zettler describes an apparatus and technique that accounts for the contribution of unfiltered radiation. Zettler points out that narrow band pass filters do not totally block infrared radiation. The unblocked infrared radiation can be problematic at the temperatures of operation (about 800° C.) because the blackbody intensity of the radiation in the infrared portion of the electromagnetic spectrum is about 9 orders of magnitude higher than in the primary band pass (i.e., the desired spectral band pass for inferring target temperature) of the narrow band pass filter. The method of Zettler involves the use of a detector that is sensitive over a broad wavelength range (from ultraviolet to the infrared) and filtering the incoming radiation with a narrow band pass filter centered near 410 nm. A longpass filter is then used to effectively block the primary band pass of the narrow band pass filter, but still allow the radiation unfiltered by the narrow band pass filter in the infrared and the near-infrared portions of the electromagnetic spectrum to pass. Zettler infers the radiation that passes through the primary band pass of the narrow band pass filter as the difference between the two measurements, i.e., between the signal attained with only the narrow band pass filter and the signal attained with both the narrow band pass filter and the longpass filter.

Another source of unwanted radiation is the contribution of "stray radiation." Stray radiation is reflected radiation that is redirected onto the target by the enclosure or other structures therein via inter-reflection and reflected into the line-of-sight of the radiation thermometer. Consider a wafer carrier with GaN wafers that are being heated to an elevated temperature of 800° C. by, for example, a microwave heating process. The components operating at the elevated temperature, such as the wafer carrier and wafers, will emit radiation in all directions, causing radiation to inter-reflect within the chamber. Some of the inter-reflected radiation will be incident on the surface targeted by the radiation thermometer and contribute to the radiation detected by the radiation thermometer. For GaN crystalline layers at 800° C., the reflectance at 410 nm is approximately 0.2. The stray radiation contribution can significantly bias the temperature value indicated by the radiation thermometer.

Stray radiation is enough of an issue when the target is at or near the maximum temperatures within the chamber. However, when measuring radiation at or near the short wavelengths of the visible spectrum (i.e., in the blue, violet or ultraviolet wavelengths), the problem becomes exacerbated when there are other sources within the chamber that are operating at substantially higher temperatures than the target. Consider the blackbody radiation of a crystalline growth layer at 800° C. According to Planck's law, the blackbody spectral emissive power at 410 nm and 800° C. is about $2.0 \times 10^{-4}$ watts/m²·μm. Now consider a heating source such as a resistance heating element that transfers heat to the crystalline growth layer via radiation and convection. Such a heating arrangement transfers heat in accordance with the first law of thermodynamics, which requires that the resistance heating element operate at a temperature that is significantly higher than the crystalline growth layer. An advantage of thermal radiative heating is that the radiation intensity can be tailored to have a profile across the wafer carrier that promotes uniformity of the temperature.

Consider, for example, a resistance heating element that operates at 1800° C. The blackbody spectral emissive power at 410 nm and 1800° C. is about $1.4 \times 10^3$ watts/m²·μm. That is an increase of about 7 orders of magnitude over the blackbody spectral emissive power at 800° C. (a typical operating temperature for crystalline growth layer during CVD operations) at the wavelength of interest (FIG. 1). Accordingly, even if only a fraction of a percent of the radiation at the 410 nm wavelength finds its way onto the detector of the radiation thermometer, the bias to the indicated temperature can be significant. Thus, the stray radiation contribution in chambers that utilize resistance heating elements can be of the same order of magnitude as the unfiltered radiation contribution identified by Zettler.

Zettler, however, is silent with respect to the contribution of stray radiation, or the effects of having radiation sources within a chamber that can effectively overwhelm the radiation that is emitted from the target. Rather, Zettler treats the target as though it is freely radiating (i.e., has no reflectance contribution). In fact, a target within a CVD chamber at that is operating at the temperatures required for crystalline growth is not freely radiating.

A chamber arrangement tailored to reduce the effects of stray radiation would be a welcomed development in the field of radiation thermometry as applied to surfaces inside high temperature process chambers.

SUMMARY OF THE INVENTION

Various embodiments of the invention reduce the contribution of stray radiation that is detected by a radiation thermometer by configuring the reactor chamber and appurtenances therein so that there is less stray radiation incident on the target of the radiation thermometer. In analyzing stray radiation for the present work, it was determined that the peripheral heating elements in a heater array account for the greatest contribution to stray radiation detected by the radiation thermometer. It has also been verified by both ray trace modeling and by verification experiments that providing a discontinuity in the portion of the peripheral heating element nearest the target area of the radiation thermometer significantly reduces the bias error caused by stray radiation.

An operating principle of various embodiments of the invention is to locally reduce the contribution of radiation from the peripheral heating element in the vicinity of the target of the radiation thermometer. In one embodiment, the local reduction in the radiation contribution is achieved by including a low heat flux portion on the peripheral heating element so that the radiant heat emitted therefrom at the operating wavelength of the radiation thermometer is significantly less than from other portions of the peripheral heating element or elements (e.g., more than two orders of magnitude lower). The low heat flux portion eliminates emission of radiation at the wavelengths of operation (e.g., in the visible spectrum) so that, locally, the peripheral heating element does not contribute to the stray radiation at the operating wavelengths of the radiation thermometer. Analysis and experimentation for this work have revealed that reducing the spectral radiation contribution proximate the target area of the radiation thermometer in this way significantly reduces the bias error due to stray radiation.

In another embodiment, local reduction of the stray radiation contribution is achieved with a radiation trap positioned proximate the peripheral heating element. Much of the radiation originating from the peripheral heating element from the segment proximate the radiation trap is thereby captured and does not contribute to the stray radiation contribution.

In another embodiment, local reduction of the stray radiation contribution is achieved by redirecting the radiation originating from a segment of the peripheral heating element. In this embodiment, a deflection surface is positioned proximate the peripheral heating element that deflects radiation originating from a portion of the peripheral heating element away from the target area of the radiation thermometer. In this way, the stray radiation contribution is reduced locally.

In one embodiment of the invention, a system for limiting stray radiation received by a radiation thermometer is described, including a chemical vapor deposition (CVD) chamber, a wafer carrier configured for rotation about a rotation axis, the wafer carrier including a top surface, a bottom surface and an outer edge, the top surface being substantially planar and defining a target plane. A plurality of heating elements are disposed beneath the wafer carrier, the plurality of heating elements being arranged to irradiate the bottom surface of the wafer carrier. The plurality of heating elements can include a peripheral heating element proximate the outer edge of the wafer carrier. The peripheral heating element can substantially surround the other heating of the plurality of heating elements, or comprised two or more heating elements that surround the other heating elements. The peripheral heating element can include a low heat flux portion along a designated portion of the peripheral heating element, the low heat flux portion operating at a substantially reduced temperature relative to other portions of the peripheral heating element. In one embodiment, the low heat flux portion configured to operate at a temperature that is at least 300° C. less than any other portion of the heating element when operating at a maximum operating temperature.

In one embodiment, a radiation thermometer is arranged for viewing of a target that is proximate an "axis of reduced scattered radiation," the axis of reduced scattered radiation being coplanar with the target plane and extending from the rotation axis and over the low heat flux portion of the heating element. The low heat flux portion of the peripheral heating element can include an electrical connector.

In one embodiment, the target is within a rectangular region on the wafer plane that includes a portion of the axis of reduced scattered radiation, the rectangular region extending from the spindle to an outer edge of the wafer carrier, the rectangular region having a width that is approximately the same width as the tangential dimension of the designated portion of the peripheral heating element.

The system can further comprise a cylinder disposed within the CVD chamber, the cylinder defining a cylinder axis that is substantially concentric with the rotation axis, the cylinder having an interior surface and an exterior surface, the interior surface defining an inner cylinder diameter, the exterior surface defining an outer cylinder diameter, the cylinder having a top edge defining an upper plane that is substantially normal to the cylinder axis. The wafer carrier can define a carrier outer diameter that is greater than the inner cylinder diameter of the cylinder. The system can also include a spindle disposed within the CVD chamber, the spindle being concentric with the rotation axis and having a distal portion adapted for coupling with the wafer carrier. In one embodiment, the radiation thermometer is configured to detect radiation in the visible portion of the electromagnetic spectrum.

In various embodiments of the invention, different mechanisms for reducing scattered radiation that is emitted from a designated portion of a peripheral heating element are presented. In one embodiment, the mechanism includes one of a radiation trap and a radiation deflector located proximate the designated portion of the peripheral heating element.

In other embodiments of the invention, a method for limiting stray radiation received by a radiation thermometer viewing a target in a chemical vapor deposition chamber is presented, the method comprising providing a wafer carrier and a heater array configured for operation within the chemical vapor deposition chamber, the wafer carrier being configured for rotation about a rotation axis and having a lower surface and a substantially planar upper surface, the upper surface defining a target plane, the heater array including a peripheral heating element that includes a low heat flux portion along a designated portion of the peripheral heating element. Instructions on a tangible medium are also provided, including the steps of:

disposing the heater array within the chemical vapor deposition chamber;

disposing the wafer carrier within the chemical vapor deposition chamber above the heater array and with the upper surface facing upward;

aligning a radiation thermometer to view a target proximate an axis of reduced scattered radiation, the axis of reduced scattered radiation being coplanar with the target plane and extending from the rotation axis and over the low heat flux portion of the heating element.

BRIEF DESCRIPTION OF THE DRAWINGS

FIG. 8A is a partial plan view of a wafer carrier within a reactor chamber, the reactor chamber including a local radiation trap in an embodiment of the invention;

FIG. 8B is a sectional view of the local radiation trap of FIG. 8A; and

FIG. 9 is a schematic of a chamber utilizing a local radiation deflector in an embodiment of the invention.

DETAILED DESCRIPTION

Figure 1:
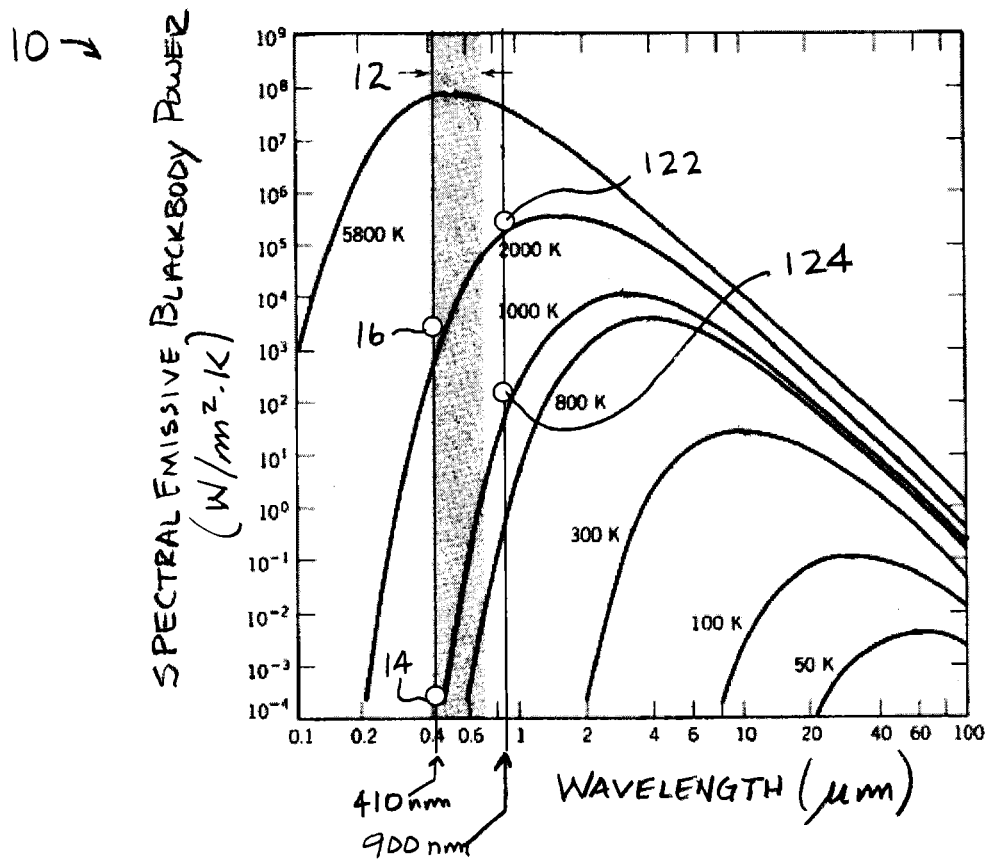
FIG. 1 is a graph of spectral blackbody emissive power according to Planck's law at various temperatures.

Referring to FIG. 1, a family of curves 10 depicting the spectral blackbody emissive power in accordance with Planck's law at various temperatures is presented. The visible spectral region 12 of the electromagnetic spectrum, coinciding approximately with the 400 nm to 700 nm wavelength band, is also identified in FIG. 1. In relation to the previous discussion of the effect of temperature on the blackbody emissive power at 410 nm, first and second reference points 14 and 16 are identified in FIG. 1 at 1073 K and 2073 K, respectively (corresponding to 800° C. and 1800° C., respectively).

Figure 2B:
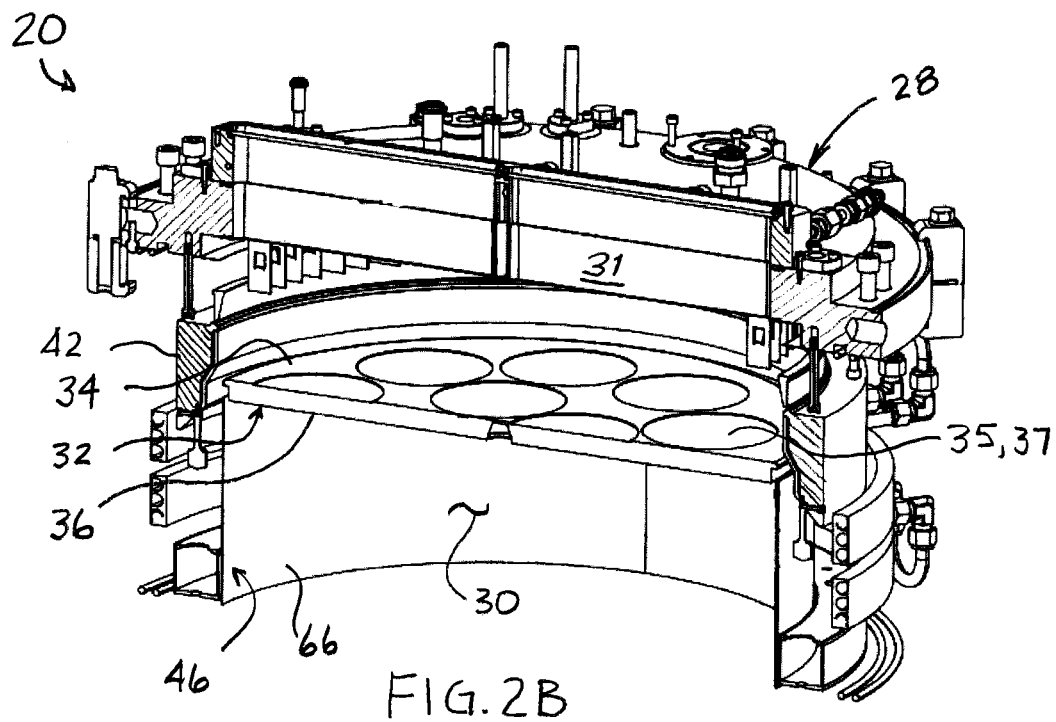
FIG. 2B is a three-dimensional cutaway view of the MOCVD chamber of FIG. 2A with the various appurtenances for modeling radiation scattering in an embodiment of the invention.
Figure 2A:
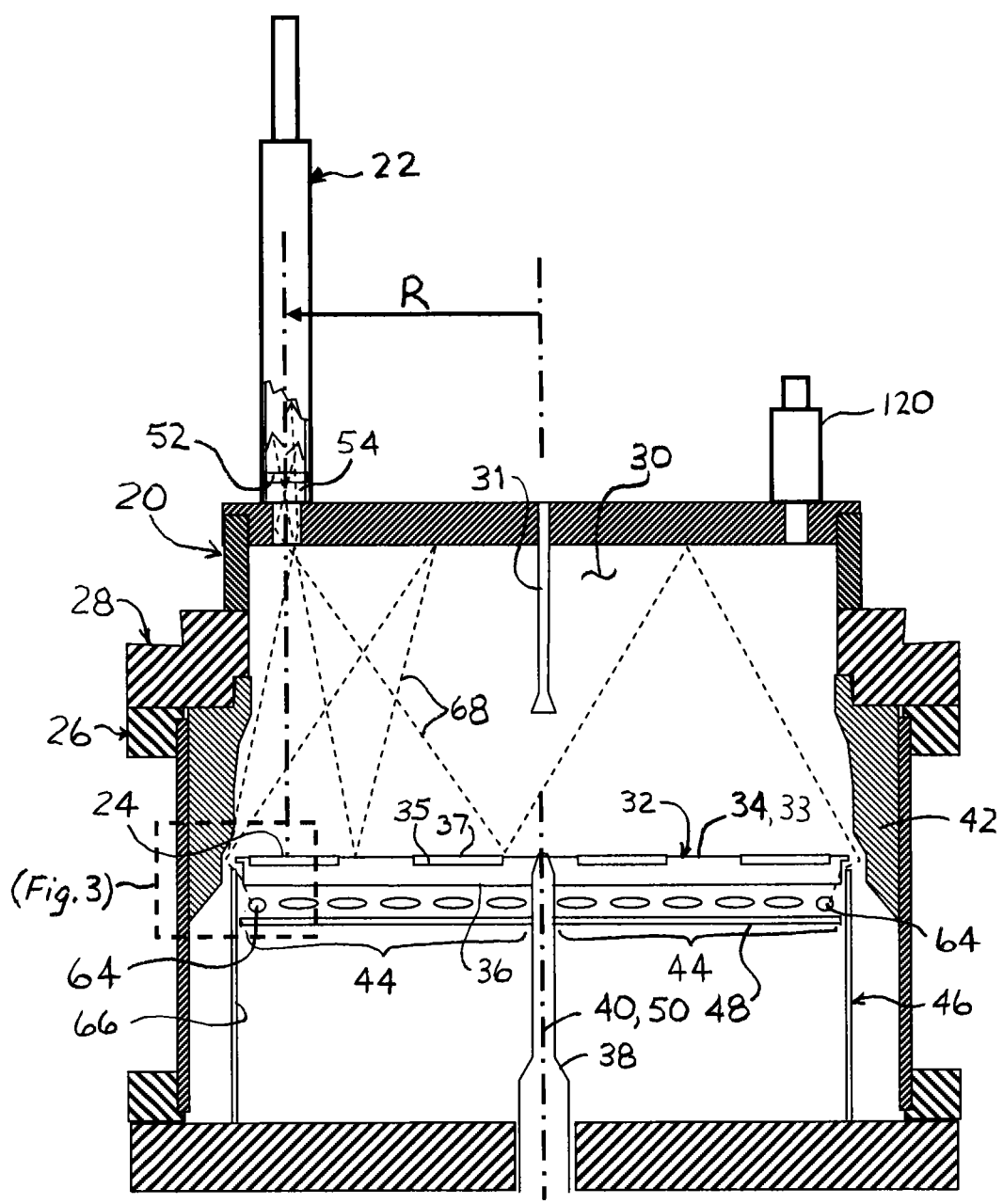
FIG. 2A is a sectional view of a MOCVD chamber with radiation thermometer.

Referring to FIGS. 2A and 2B, a MOCVD reactor system 20 utilizing a radiation thermometer 22 arranged to view a target 24 within the MOCVD reactor system 20 is depicted. The MOCVD reactor system 20 includes a reactor chamber 26 operatively coupled with a flow flange 28 to define an enclosure 30. The flow flange 28 includes laminar flow plates 31 through which the gases for the MOCVD process are introduced into the reactor chamber 26. Disposed within the reactor chamber 26 is a wafer carrier 32 having a top surface 34 that defines a target plane 33 on which the target 24 of the radiation thermometer is substantially fixed. The top surface also defines wafer pockets 35 for holding substrates or wafers 37. The wafer carrier 32 also includes a bottom surface 36 and is operatively coupled with a spindle 38 that defines a rotation axis 40. A body shutter 42 can be removably inserted adjacent the interior wall of the reactor chamber 26 and surrounds the wafer carrier 32.

A heater array 44 is disposed beneath the wafer carrier 32 for radiative coupling with the bottom surface 36 of the wafer carrier 32. The heater array 44 can be surrounded by a cylinder 46 and also bounded beneath with a filament mounting plate 48 to enhance radiative coupling between the heater array 44 and the wafer carrier 32. The cylinder 46 defines a cylinder axis 50 substantially concentric with the rotation axis 40.

The radiation thermometer 22 is mounted atop the flow flange 28 and oriented to view the top surface 34 of the wafer carrier 32 through a view port window 52. In one embodiment, the view port window 52 is disposed in a recess 54, which can be actively cooled.

The heater array 44 can include a peripheral heating element 64. The peripheral heating element 64 is so-named because it defines the outer periphery of the heater array 44. While the peripheral heating element 64 depicted herein is a single heating element, a heater arrangement wherein peripheral (i.e., outermost) heating elements are comprised of two or more heating elements is contemplated as being within the scope of the invention.

To promote uniform heating, the peripheral heating element 64 in the depicted embodiment is located proximate an interior surface 66 of the cylinder 46. A plurality of rays 68 are depicted as being emitted from the peripheral heating element 64, inter-reflecting within the enclosure 30, and entering the radiation thermometer 22.

Figure 3:
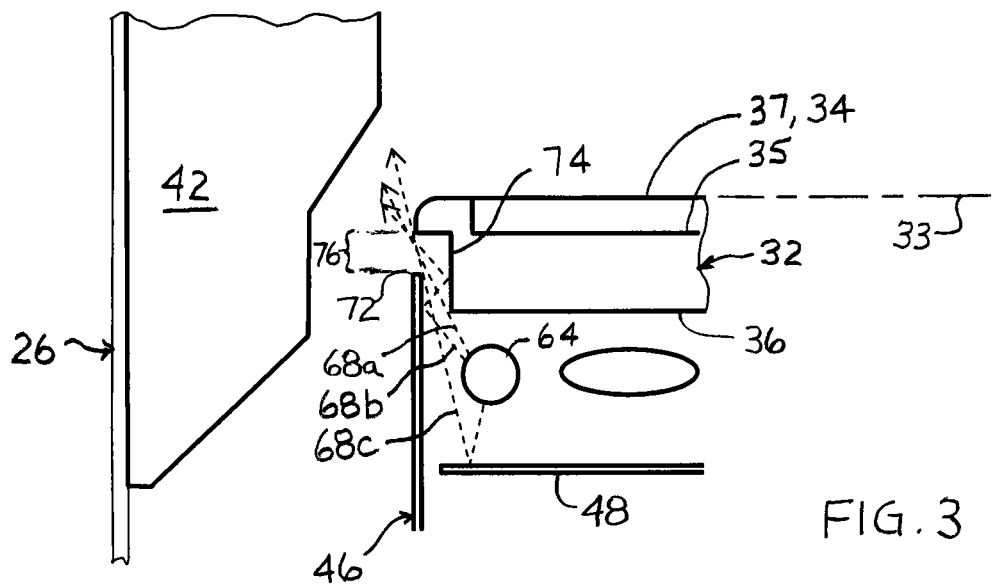
FIG. 3 is a schematic of the radiation emitted from a portion of the peripheral heating element of FIG. 2A.

Referring to FIG. 3, the region near a top edge 72 of the cylinder 46 and an outer edge 74 of the wafer carrier 32 is depicted in an embodiment of the invention. A gap 76 is defined between the outer edge 74 and the top edge 72 to enable the wafer carrier 32 to freely rotate. Rays 68a, 68b and 68c, depicted as being emitted from the peripheral heating element 64, represent three kinds of radiation that exit the gap 76: ray 68a represents direct radiation that exits the gap 76 without being reflected; ray 68b represents radiation that is scattered off the interior surface 66 of the cylinder 46 and the outer edge 74 of the wafer carrier 32; and ray 68c represents the radiation that is scattered off the bottom surface 36 of the wafer carrier 32 and the filament mounting plate 48.

In operation, the wafer pockets 35 can be loaded with substrates 37 (e.g., sapphire). The wafer carrier 32 is rotated about the rotation axis 40 and the heater array 44 energized to a temperature of approximately 1800° C. Gases are introduced through the laminar flow plates 31 to form a crystalline growth material (e.g., GaN) on the wafer carrier 32, including the wafer pockets 35 and any substrate 37 contained therein. The temperature of the crystalline growth material during operation is on the order of 800° C.

The operating conditions of the enclosure 30 as substantially depicted in FIGS. 2A and 2B was modeled using a three-dimensional ray tracing program. The ray tracing model was executed to identify stray radiation paths and to analyze stray radiation entering the view port window 52. The peripheral heating element 64 was assumed to be continuous and set as a radiation source operating at a temperature of 1800° C. The wafer carrier 32 (modeled as including wafers 37 in the wafer pockets 35) was modeled as both a radiation source at 800° C. and as a scattering media. The blackbody emissive power for the radiation sources was established based on Planck's law at a wavelength of 405 nm. The interior walls of the enclosure 30 (including the body shutter 42, laminar flow plates 31 and viewport 52) were also modeled as scattering media.

The radiation thermometer 22 was modeled at two different positions: an "outer" position at a radius R proximate the center of the outermost wafer pockets 35 (depicted in FIG.

2A); and a "mid-span" position centered at approximately ⅔ R between the outer position and the rotation axis 40. The amount of 405 nm radiation emitted from the target 24 and directly entering the radiation thermometer 22 ("signal radiation") was compared with the amount of 405 nm radiation inter-reflected within the enclosure 30 and entering the radiation thermometer 22 ("stray radiation"). The results are presented in Table 1.

TABLE 1

Predicted fraction of radiation wavelength attributed to signal and stray radiation at 405 nm (target at 800° C.; peripheral heating element at 1800° C.)

|  | Outer Position | Middle Position |
|---|---|---|
| Signal Radiation | 3% | 30% |
| Stray Radiation | 97% | 70% |
| Temperature Error at 405 nm wavelength | 127° C. | 41° C. |

The ray tracing model predicted that, for a peripheral heating element 64 that forms a continuous ring and for the radiation thermometer 22 centered at the outer position, about 97% of the radiation flux at the 405 nm wavelength on the detector of a standard radiation thermometer is attributed to stray radiation. At the middle position, stray radiation is predicted to account for about 70% of the total signal. These stray radiation contributions cause temperature bias errors of approximately 127° C. and 41° C., respectively. Furthermore, the results of the ray tracing model indicate that about 92% of the stray radiation reaching the detector of the radiation thermometer originates from radiation scattered off the bottom surface 36 of the wafer carrier 32 and the filament mounting plate 48 (as represented by ray 68c in FIG. 3).

Figure 4:
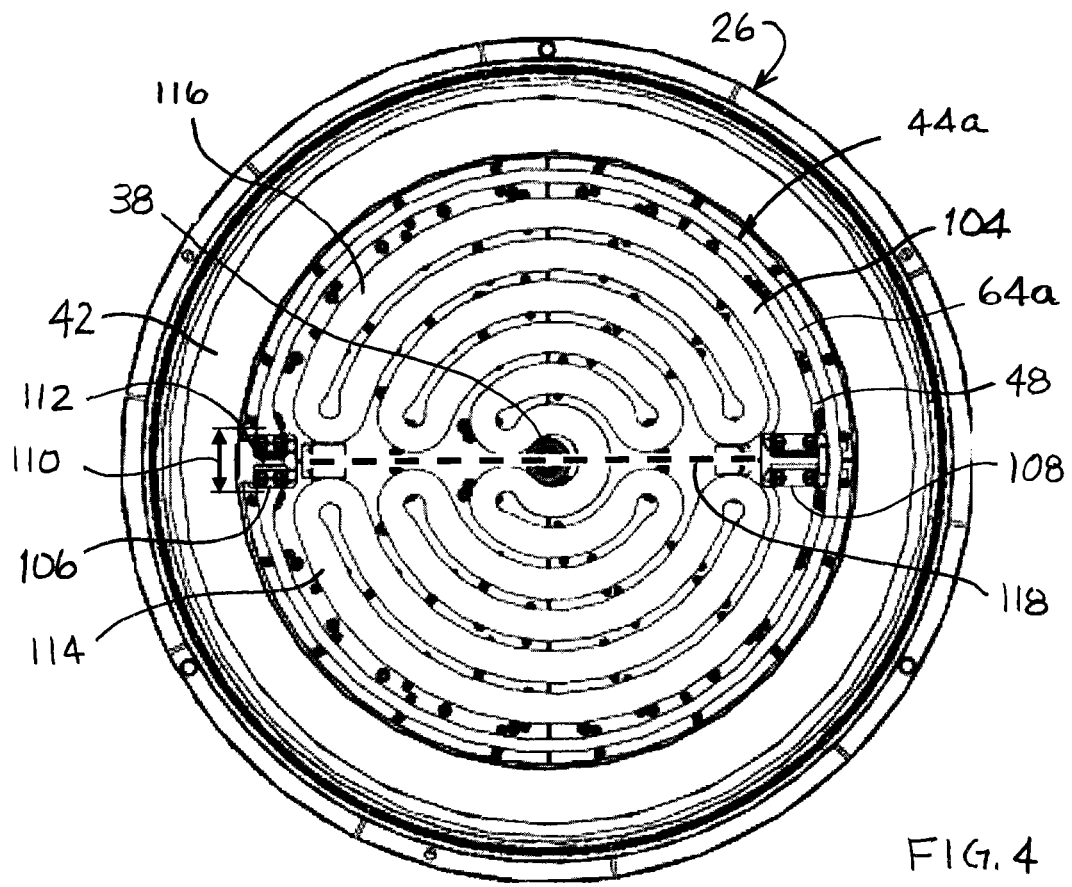
FIG. 4 is a plan view of a heating element arrangement within a reactor chamber (wafer carrier removed) in an embodiment of the invention.

Referring to FIG. 4, a heater array 44a including an interior heating element 104 and a peripheral heating element 64a is depicted in an embodiment of the invention. The flow flange 28 and wafer carrier 32 are removed from this view to clearly show the layout of the heater array 44a. The spindle 38, body shutter 42 and filament mounting plate 48 are also visible in this view. The heating elements 64a and 104 include electrical connectors 106 and 108, respectively.

The terminal connection 106 occupies an arc segment 110 of the peripheral heating element 64a wherein the electrical resistance is substantially reduced in comparison to other arc segments of the peripheral heating element of equal length. That is, the arc segment 110 constitutes a low heat flux portion 112 of the peripheral heating element 64a. The terminal connection 106 operates at a substantially reduced temperature from the high resistance portion of the peripheral heating element 64a. For example, in one non-limiting embodiment, the peripheral heating element 64a operates at a maximum operating temperature of nominally 2000° C. At this operating condition, the terminal connection 106 operates at approximately 1500° C. and the nominal temperature across the arc segment 110 is believed to operate at 1700° C. or less, or at least 300° C. less than the operating temperature of the high resistance portion of the peripheral heating element 64a. Thus, in terms of operating temperature, the low heat flux portion 112 (i.e., the electrical connector 106) of the peripheral heating element 64a operates at a substantially lower temperature than the remainder of the peripheral heating element 64a, so that the radiation contribution of the low heat flux portion 112 at 405 nm is about two orders of magnitude less than the high resistance portion of the peripheral heating element 64a (see FIG. 1).

The interior heating element 104 of the heater array 44a is arranged so that a first half-length 114 is within a first semicircle and a second half-length 116 is within a second semicircle. Accordingly, there is a line of discontinuity 118 that lies between the first and second half-lengths 114 and 116, bridged only at one location near the spindle 38 and the electrical connector 108.

An experiment was conducted to determine the relative contribution of the peripheral heating element 64a to the stray radiation contribution at the 405 nm wavelength as compared to the heater array 44a as a whole. The interior heating element 104 and the peripheral heating element 64a were fully energized and controlled to maintain the wafer carrier 32 at a steady state temperature near 800° C., as would be done in a normal crystalline growth operation. Then, the power to the peripheral heating element 64a was capped so that the peripheral heating element 64a could operate only at about half capacity, while still controlling the system to heat the wafer carrier 32 at or near the 800° C. temperature. In this way, the radiation contribution of peripheral heating element 64a at the 405 nm wavelength was reduced to negligible, while the wafer carrier 32 remained essentially at temperature and the interior heating element 104 actually operated at a somewhat higher temperature to make up for the reduced heat input from the peripheral heating element 64a. Then, the power to the interior heating element 104 was also capped at approximately half capacity. A measurement was made with the radiation thermometer 22 at all three operating conditions, with the third condition (both the peripheral heating element 64a and the interior heating element 104 at half capacity) being taken immediately after capping the capacity of the interior heating element 104. Based on these measurements, it was determined that the peripheral heating element 64a contributed between 80% and 90% of the stray radiation received by the radiation thermometer 22. Thus, the simplification of modeling only the radiation originating from the peripheral heating element 64 instead of the entire heater array 44 of FIG. 2A was validated.

A theory was developed that, because such a large fraction of the stray radiation originates from the peripheral heating element 64, stray radiation may be controlled locally by limiting the emission of the peripheral heating element locally. That is, if the target 24 of the radiation thermometer 22 is fixed on a region of the target plane 33 that is proximate a zone of the peripheral heating element 64 of which emitted radiation is largely reduced, captured or transferred away, the stray radiation received by the radiation thermometer should be reduced.

A stray radiation detection experiment was conducted to test this theory. The radiation thermometer 22 was configured to detect electromagnetic radiation across a narrow band pass centered nominally at 405 nm. A second, infrared radiation thermometer 120 (FIG. 2A) was configured to detect electromagnetic radiation across a band pass centered nominally at 900 nm. Recall, as described supra, the change in the spectral blackbody emissive power is extremely sensitive to temperature changes at 405 nm (numerical references 14 and 16, FIG. 1). Accordingly, the radiation thermometer 22 configured to detect radiation nominally at 405 nm is extremely sensitive to stray radiation originating from the peripheral heating element 64. However, at the 900 nm wavelength (referring again to FIG. 1 and Planck's law), in the temperature region of interest (nominally 2100 K), the change in the spectral blackbody emissive power is very insensitive to temperature change at 900 nm (see numerical reference 122, FIG. 1). Accordingly, the infrared radiation thermometer 120 operating at 900 nm is substantially less sensitive to stray radiation originating from the peripheral heating element 64, and instead is more sensitive to changes in the temperature of the wafer carrier 32 (nominally at 1100 K; see numerical reference 124, FIG. 1).

Therefore, the stray radiation detection experiment is based on a comparison of the indicated temperatures from a detector that is highly sensitive to stray radiation (the radiation thermometer 22) and the indicated temperatures from a reference device that is insensitive to stray radiation (the infrared radiation thermometer 120).

Figure 5:
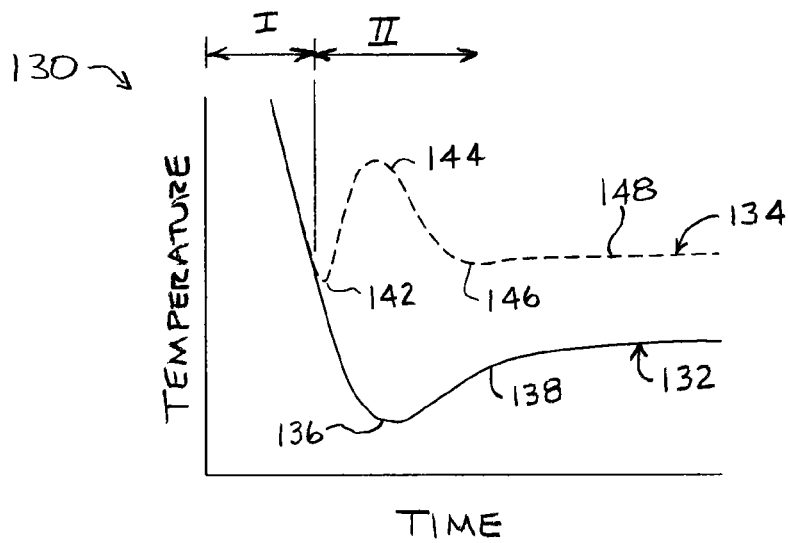
FIG. 5 is a graph comparing the response of an infrared radiation thermometer and an optical radiation thermometer, both viewing a wafer carrier during a heating cycle of a heater array.

Referring to FIG. 5, a typical stray radiation signature 130 is depicted. The stray radiation signature 130 is based on comparison of an infrared temperature signal 132 produced by the infrared radiation thermometer 120 and an optical or "blue light" temperature signal 134 produced by the radiation thermometer 22 detecting radiation at nominally 405 nm. For the data presented in FIG. 5, both the radiation thermometer 22 and the infrared radiation thermometer 120 viewed target locations on the target plane 33 that are similarly situated (i.e., at similar radii from the rotation axis 40). Also, the data in FIG. 5 has been normalized so that the initial temperatures shown in initial cool down (first zone I of FIG. 5) track the same.

For the stray radiation detection experiment, the MOCVD reactor system 20 was operated to bring the wafer carrier to a first control temperature. Then the control temperature was adjusted downward to a lower set point temperature below the first elevated temperature. A first zone I of the stray radiation signature 130 depicts the cooling of the wafer carrier 32 as a steady drop in the temperature signals 132 and 134. A second zone II of the stray radiation signature 130 depicts a recovery of the temperature signals 132 and 134 as the temperature controller of the MOCVD system 20 establishes a controlled equilibrium at the lower set point temperature.

The infrared temperature signal 132 substantially traces the true temperature profile of the wafer carrier during the above-described process. That is, the true temperature of the wafer carrier 32 undergoes a gradual inflection 136 followed by a substantially monotonic rise 138 in temperature in the zone II portion of the stray radiation signature 130. The gradual inflection 136 and monotonic rise in temperature 138 are a result of the thermal mass of the wafer carrier 32.

The optical temperature signal 134, however, is characterized by a sharp inflection 142 followed by a substantial overshoot 144 and a slight undershoot 146 in the zone II portion of the stray radiation signature 130 before settling at a controlled equilibrium temperature 148. The optical temperature signal 134 is a convolution of the emitted signal from the wafer carrier 32 and the stray radiation incident on the target 24 of the target plane 33 and reflected into the radiation thermometer 22. The overshoot 144 and undershoot 146 is characteristic of a proportional gain temperature profile experienced by the heater array 44 when responding to a new set point. It is believed that the optical temperature signal 134 closely tracks the control temperature profile of the heater array 44 because the optical temperature signal 134 is dominated by the stray radiation component, as predicted by the ray tracing model.

Therefore, one can qualitatively determine whether the radiation received by the radiation thermometer 22 has a strong scattered radiation component. Temperature signals that follow a profile similar to the infrared radiation signal 132 (gradual inflection with monotonic rise) are not dominated by scattered radiation, whereas temperature signals that follow a profile similar to the optical radiation signal 132 (sharp inflection with substantial overshoot) are dominated by scattered radiation.

Figure 6:
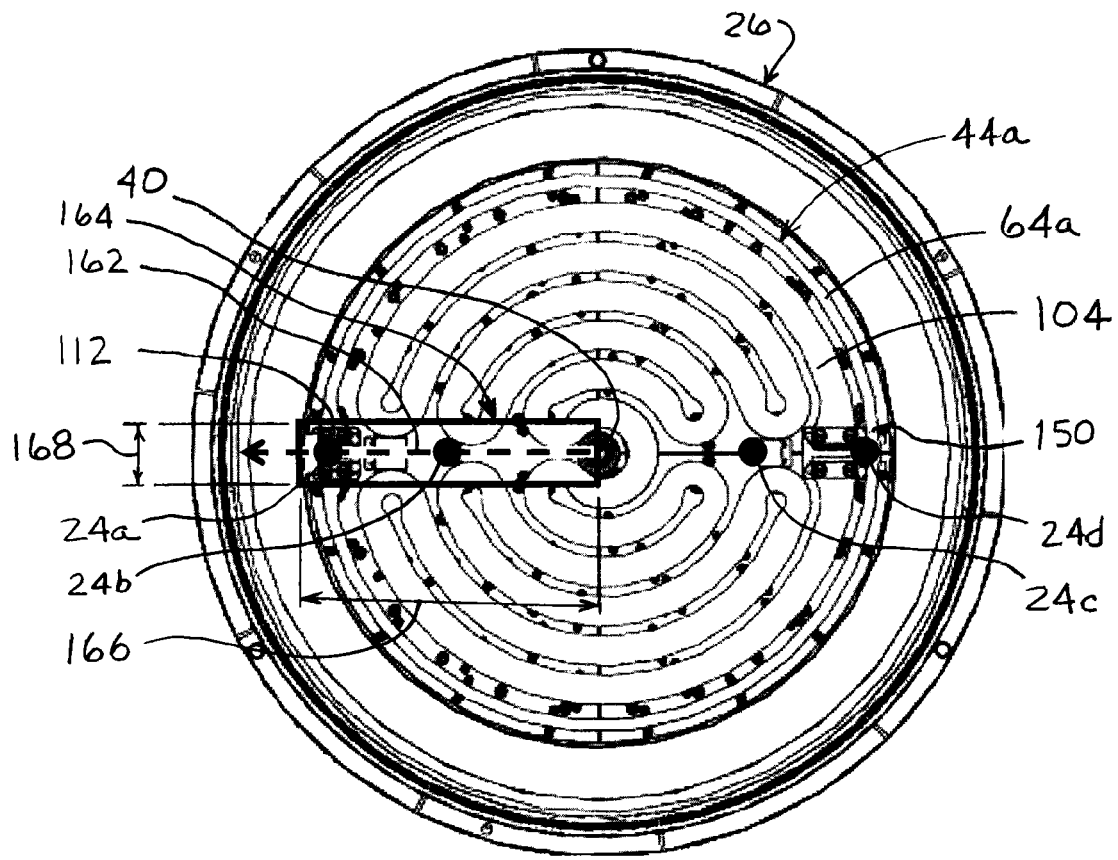
FIG. 6 is the plan view of FIG. 4, depicting the alignment of the targets relative to the heater array for a stray radiation detection experiment in an embodiment of the invention.

Referring to FIG. 6, the stray radiation detection experiment was repeated by viewing targets 24*a*, 24*b*, 24*c* and 24*d* at several different locations on the target plane 33 with the radiation thermometer 22, again configured to detect radiation at the 405 nm nominal wavelength. While FIG. 6 depicts an exposed heater array 44*a*, it is understood that during the stray radiation detection experiment the wafer carrier 32 was in place and operating in a rotating mode. Accordingly, FIG. 6 depicts the orientation of the heater array 44*a* in relation to where the targets 24*a* through 24*d* fall on the target plane 33 located above the heater array 44*a*.

To test the theory that stray radiation is reduced proximate a low heat flux portion of the peripheral heating element 64*a*, the heater array 44*a* was arranged so that the low heat flux portion 112 was proximate targets 24*a* and 24*b*, while the portion of the peripheral heating element 64*a* proximate the targets 24*c* and 24*d* was a continuous portion 150 and having a high heat flux. Targets 24*a* and 24*d*, though diametrically opposed, were both centered at a radial distance of approximately 195 mm (7.68 inches) from the rotation axis 40. Likewise, targets 24*b* and 24*c*, though diametrically opposed, were both centered at a radial distance of approximately 142 mm (5.6 inches) from the rotation axis 40.

Figure 7A:
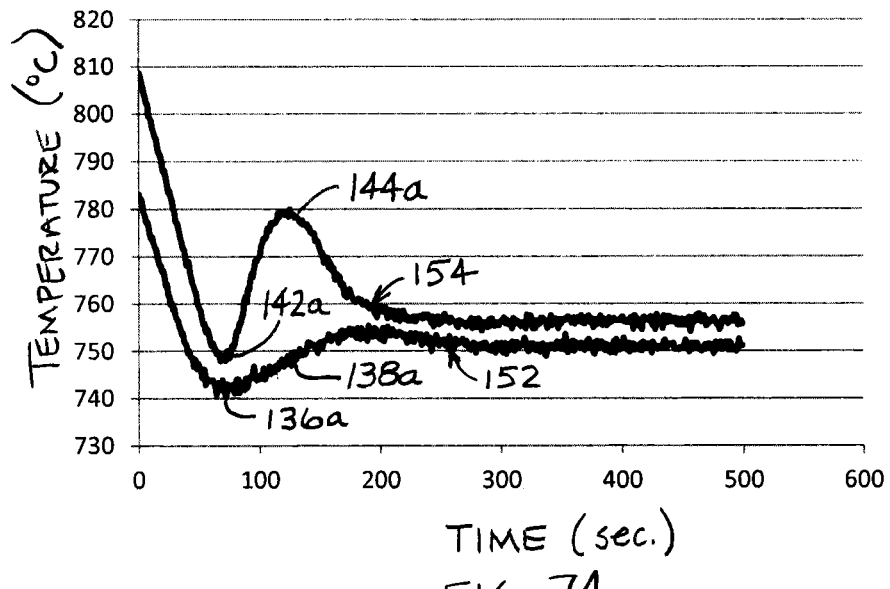
FIG. 7A is a graph comparing the response of a radiation thermometer arranged to view outer radial positions of a wafer carrier proximate a high heat flux portion of a peripheral heating element and proximate a low heat flux portion of a peripheral heating element in an embodiment of the invention.
Figure 7B:
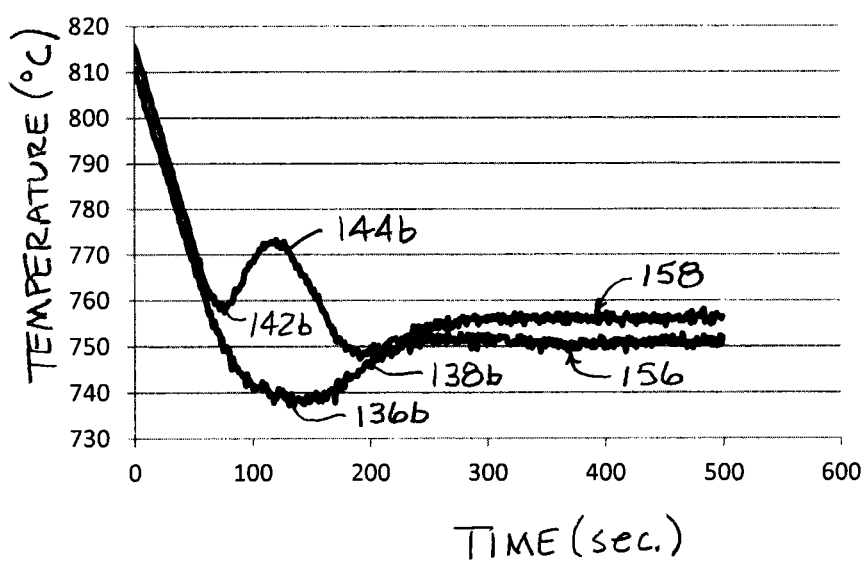
FIG. 7B is a graph comparing the response of a radiation thermometer arranged to view midspan radial positions of a wafer carrier proximate a high heat flux portion of a peripheral heating element and proximate a low heat flux portion of a peripheral heating element in an embodiment of the invention.

Referring to FIGS. 7A and 7B, the results of the tests are presented. Optical temperature signals 152 and 154 of FIG. 7A were acquired from targets 24*a* and 24*d*, i.e., at an outer radial position. Note that the optical temperature signal 154, acquired proximate a continuous, high heat flux portion of the peripheral heating element 64*a*, has a temperature profile characteristic of a high stray radiation component (sharp inflection 142*a* with a strong overshoot 144*a*). However, the optical temperature signal 152, acquired proximate the low heat flux zone 112 of the peripheral heating element 64*a*, has the same temperature profile characteristics as the infrared radiation signal 132 of FIG. 5 (gradual inflection 136*a* with monotonic rise in temperature 138*a*).

With respect to FIG. 7B, optical temperature signals 156 and 158 were acquired from targets 24*b* and 24*c*, respectively, i.e., at mid-span positions. The optical temperature signal 158, acquired at a mid-span position proximate the continuous, high heat flux portion of the peripheral heating element 64*a*, also has a temperature profile characteristic of a high stray radiation component (sharp inflection 142*b* with a strong overshoot 144*b*). However, the optical temperature signal 156, acquired at a mid-span position proximate the low heat flux zone 112 of the peripheral heating element 64*a*, has the same temperature profile characteristics as the infrared radiation signal 132 of FIG. 5 (gradual inflection 136*b* with monotonic rise in temperature 138*b*).

Accordingly, an axis of reduced scattered radiation 162 (FIG. 6) is defined on the target plane 33 as extending radially from the rotation axis 40 and over the center of the low heat flux zone 112. Targets 24 on the target plane 33 that are proximate the axis 162 have a reduced stray radiation component, thus incurring a reduced bias in the temperature determination compared to targets acquired elsewhere on the target plane 33. In one embodiment, the target 24 is centered along or otherwise touches or overlaps the axis 162. In another embodiment, the target 24 falls within a rectangular zone 164 of reduced stray radiation, defined as having a length 166 that extends from the rotation axis 40 to the outer edge 74 of the wafer carrier 32 (not depicted in FIG. 6) and having an approximate width 168 defined by the chord of the arc segment 110.

Referring to FIGS. 8A and 8B, a radiation trap 172 for capturing a portion of the radiation that is emitted from a designated portion 174 of the peripheral heating element 64 is depicted in an embodiment of the invention. In one embodiment, the radiation trap 172 comprises a cavity 176 defined in the body shutter 42 having a tangential dimension 178. In one embodiment, the designated portion 174 of the peripheral heating element 64 is defined as the arc segment that is immediately adjacent the radiation trap 172 and having the same tangential dimension 178.

In operation, a portion of the radiation 180 emitted from the designated portion 174 is transferred into the cavity 176, either by direct radiation or by reflection off the various surfaces proximate the radiation trap 172. The radiation trap 172 thus limits the propagation of radiation locally by capturing the radiation 180. In this embodiment, the axis of reduced scattered radiation 162 is defined on the target plane 33 and extends from the rotation axis 40 and through the tangential center of the cavity 176. The width 168 of rectangular zone 164 of reduced stray radiation is defined by the chord of the tangential dimension 178.

Referring to FIG. 9, a radiation deflector 192 for deflecting a portion of the radiation that is emitted from a designated portion 194 of the peripheral heating element 64 is depicted in an embodiment of the invention. In one embodiment, the radiation deflector 192 comprises a convexity 196 that protrudes radially inward proximate the outer edge 74 of the wafer carrier 32. The convexity 196 can be characterized as having a tangential dimension 198. In one embodiment, the designated portion 194 of the peripheral heating element 64 is defined as the arc segment that is immediately adjacent the radiation deflector 192 and having the same tangential dimension 198 of the convexity 196.

In operation, a portion of the radiation 202 emitted from the designated portion 174 is transferred into the convexity 196, either by direct radiation or by reflection off the various surfaces proximate the radiation deflector 192. The radiation deflector 192 thus limits the incidence of radiation locally by scattering the radiation 202 away from a plane 204 that is defined by the rotation axis 40 and passing through the convexity 196. In this embodiment, the axis of reduced scattered radiation 162 is defined by the confluence of the target plane 33 and plane 204 and extends from the rotation axis 40 through the radiation deflector 192. The width 168 of rectangular zone 164 of reduced stray radiation is defined by the chord of the tangential dimension 198 of the radiation deflector 192.

In one embodiment of the invention, the heating element is provided with hardware for implementing at least one of the techniques for locally reducing stray radiation presented herein. A set of instructions is also provided on a tangible medium (e.g., written paper copy or computer accessible), the instructions describing how to align a radiation thermometer relative to the orientation of the heating element for a reduced stray radiation component, as described herein. Such a combination can be utilized, for example, for retrofitting existing CVD reactor systems.

While the discussion herein focuses primarily on application in MOCVD reactor systems, it is noted that the principles explained herein can apply to other types of CVD chambers, as well as chambers generally in that utilize radiation thermometers.

The following references are hereby incorporated by reference in their entirety except for express definitions and patent claims contained therein: U.S. Patent Application Publication No. 2011/0064114 to Zettler et al.; co-pending U.S. patent application Ser. No. 13/531,162 entitled "Radiation Thermometer Using Off-Focus Telecentric Optics," naming Guray Tas and Jing Zhou inventors and filed on even date herewith.

References to relative terms such as upper and lower, front and back, left and right, or the like, are intended for convenience of description and are not contemplated to limit the invention, or its components, to any specific orientation. All dimensions depicted in the figures may vary with a potential design and the intended use of a specific embodiment of this invention without departing from the scope thereof.

Each of the additional figures and methods disclosed herein may be used separately, or in conjunction with other features and methods, to provide improved devices, systems and methods for making and using the same. Therefore, combinations of features and methods disclosed herein may not be necessary to practice the invention in its broadest sense and are instead disclosed merely to particularly describe representative embodiments of the invention.

For purposes of interpreting the claims for the present invention, it is expressly intended that the provisions of Section 112, sixth paragraph of 35 U.S.C. are not to be invoked unless the specific terms "means for" or "step for" are recited in the subject claim.

What is claimed is:

1. A system for performing chemical vapor deposition, comprising:
   a chemical vapor deposition (CVD) chamber;
   a wafer carrier configured for rotation about a rotation axis and including a top surface, a bottom surface and an outer edge, said top surface being substantially planar and defining a target plane;
   a plurality of heating elements disposed beneath said wafer carrier, said plurality of heating elements arranged to irradiate said bottom surface of said wafer carrier, said plurality of heating elements including a peripheral heating element proximate said outer edge of said wafer carrier, said peripheral heating element including a low heat flux portion along a designated portion of said peripheral heating element, said low heat flux portion operating at a substantially reduced temperature relative to other portions of said peripheral heating element; and
   a radiation thermometer arranged for viewing a target that is within a rectangular region on said wafer carrier, said rectangular region extending from said spindle to an outer edge of said wafer carrier, said rectangular region having a width that is approximately the same width as the low heat flux portion of said designated portion of said peripheral heating element.

2. The system of claim 1, wherein said radiation thermometer is arranged to view a target that is within the rectangular region on said wafer plane that includes a portion of said axis of reduced scattered radiation, said rectangular region extending from said spindle to an outer edge of said wafer carrier, said rectangular region having a width that is approximately the same width as the low heat flux portion of said designated portion of said peripheral heating element.

3. The system of claim 1, wherein said low heat flux portion of said peripheral heating element includes an electrical connector.

4. The system of claim 1, further comprising a cylinder disposed within said CVD chamber, said cylinder defining a cylinder axis that is substantially concentric with said rotation axis, said cylinder having an interior surface and an exterior surface, said interior surface defining an inner cylinder diameter, said exterior surface defining an outer cylinder diameter, said cylinder having a top edge defining an upper plane that is substantially normal to said cylinder axis.

5. The system of claim 4, wherein said wafer carrier defines a carrier outer diameter that is greater than said inner cylinder diameter of said cylinder.

6. The system of claim 1, wherein said peripheral heating element substantially surrounds the other of said plurality of heating elements.

7. The system of claim 1, wherein said radiation thermometer is configured to detect radiation in the visible portion of the electromagnetic spectrum.

8. The system of claim 1, further comprising a spindle disposed within said CVD chamber, said spindle being concentric with said rotation axis and having a distal portion adapted for coupling with said wafer carrier.

9. The system of claim 1, wherein said low heat flux portion configured to operate at a temperature that is at least 300° C. less than any other portion of said heating element when operating at a maximum operating temperature.

10. A system for performing chemical vapor deposition, comprising:

a chemical vapor deposition (CVD) chamber;

a wafer carrier configured for rotation about a rotation axis, said wafer carrier having a top surface, a bottom surface and a peripheral edge, said top surface defining a target plane substantially orthogonal to said rotation axis;

a heating element disposed adjacent said bottom surface of said wafer carrier, said heating element being proximate said peripheral edge of said wafer carrier, said heating element including a low heat flux portion configured to operate at a temperature that is at least 300° C. less than any other portion of said heating element when operating at a maximum operating temperature; and a view port for a radiation thermometer, said viewport arranged for viewing a target that is within a rectangular region on said target plane, said rectangular region extending from said spindle to an outer edge of said wafer carrier, said rectangular region having a width that is approximately the same width as the low heat flux portion of said designated portion of said peripheral heating element.

11. The system of claim 10, further comprising a radiation thermometer arranged to view a target through said view port, said target being proximate said axis of reduced scattered radiation.

12. The system of claim 11, wherein said radiation thermometer is configured to detect radiation in the visible portion of the electromagnetic spectrum.

* * * * *